(12) United States Patent
Ho

(10) Patent No.: US 10,823,785 B2
(45) Date of Patent: Nov. 3, 2020

(54) METHOD OF ESTIMATING THE STATE OF CHARGE OF A BATTERY AND SYSTEM THEREOF

(71) Applicant: RICHTEK TECHNOLOGY CORPORATION, Zhubei (TW)

(72) Inventor: Chang-Yu Ho, Zhubei (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 592 days.

(21) Appl. No.: 15/678,108

(22) Filed: Aug. 15, 2017

(65) Prior Publication Data

US 2017/0343610 A1  Nov. 30, 2017

Related U.S. Application Data

(63) Continuation-in-part of application No. 14/798,862, filed on Jul. 14, 2015, now abandoned, and a continuation-in-part of application No. 14/617,982, filed on Feb. 10, 2015, now abandoned.

(51) Int. Cl.
*G01R 31/367* (2019.01)
*H02J 7/00* (2006.01)
*G01R 31/3835* (2019.01)
*G01R 31/3842* (2019.01)

(52) U.S. Cl.
CPC ....... *G01R 31/3835* (2019.01); *G01R 31/367* (2019.01); *H02J 7/0047* (2013.01); *G01R 31/3842* (2019.01); *H02J 7/0048* (2020.01); *H02J 7/0049* (2020.01)

(58) Field of Classification Search
CPC .............. G01R 31/3835; G01R 31/367; G01R 31/3842; H02J 7/0047; H02J 7/0049; H02J 7/0048
See application file for complete search history.

(56) References Cited

U.S. PATENT DOCUMENTS

2012/0166116 A1\* 6/2012 Yoshida ............. G01R 31/3842
  702/63
2012/0323512 A1\* 12/2012 Rhodin .............. G01R 31/3842
  702/63

\* cited by examiner

*Primary Examiner* — Alexander Satanovsky
*Assistant Examiner* — Mark I Crohn
(74) *Attorney, Agent, or Firm* — Tung & Associates

(57) ABSTRACT

The invention relates to a method for estimating the state of charge (SOC) of a battery when battery is in the at least states of: charging, discharging, and relaxing. The invention makes use of the battery voltage (VBAT) instead of the battery current. In order to build models in the method, we use standard charging and discharging processes to collect battery information.

10 Claims, 14 Drawing Sheets

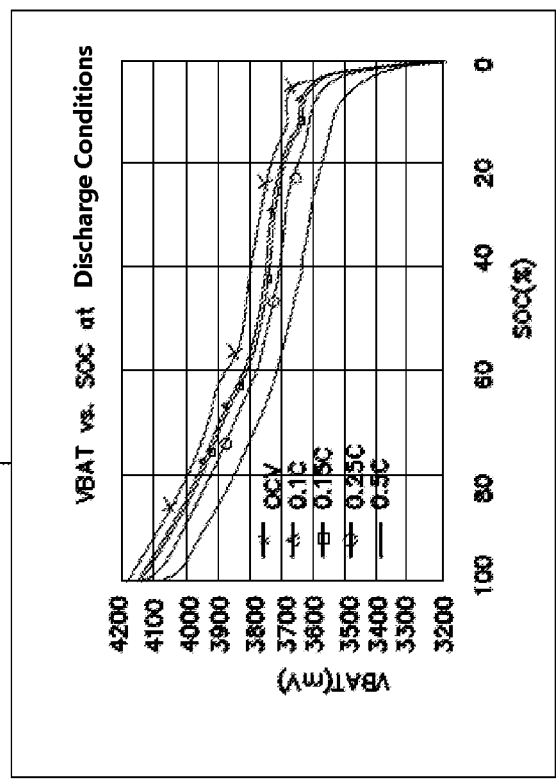
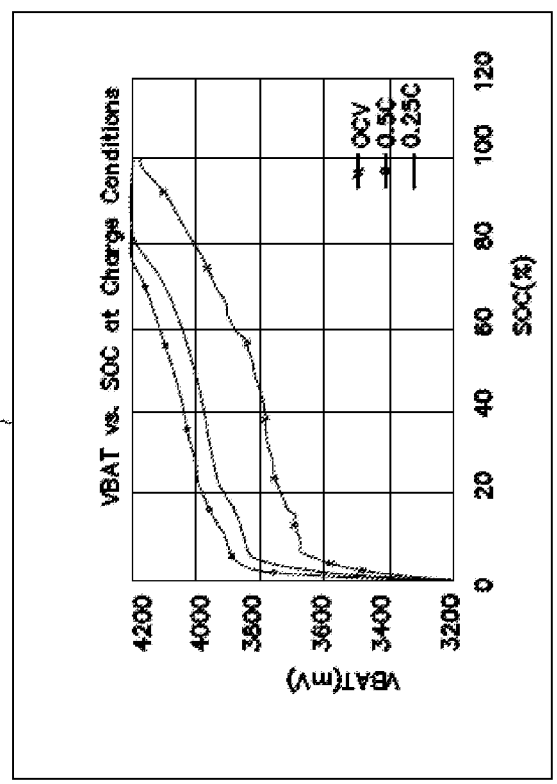
Fig. 2

METHOD OF ESTIMATING THE STATE OF CHARGE OF A BATTERY AND SYSTEM THEREOF

CROSS REFERENCE TO RELATED APPLICATIONS

This application is a continuation-in-part application of U.S. Ser. No. 14/798,862, filed on Jul. 14, 2015, which is a continuation-in-part application of U.S. Ser. No. 14/617, 982, filed on Feb. 10, 2015.

BACKGROUND

The battery state of charge (SOC) is essential information for the users of portable electronic devices. The SOC of a fully-charged battery refers to 100%; the SOC of a fully-discharged battery would be 0%. There is a need for estimating the SOC by using embedded methods within the portable electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a measurement result for building the weighting fuzzifier and dSOC/dV fuzzifier in the method of estimating the state of charge of a battery in accordance with some embodiments.

DETAILED DESCRIPTION

Figure 1:
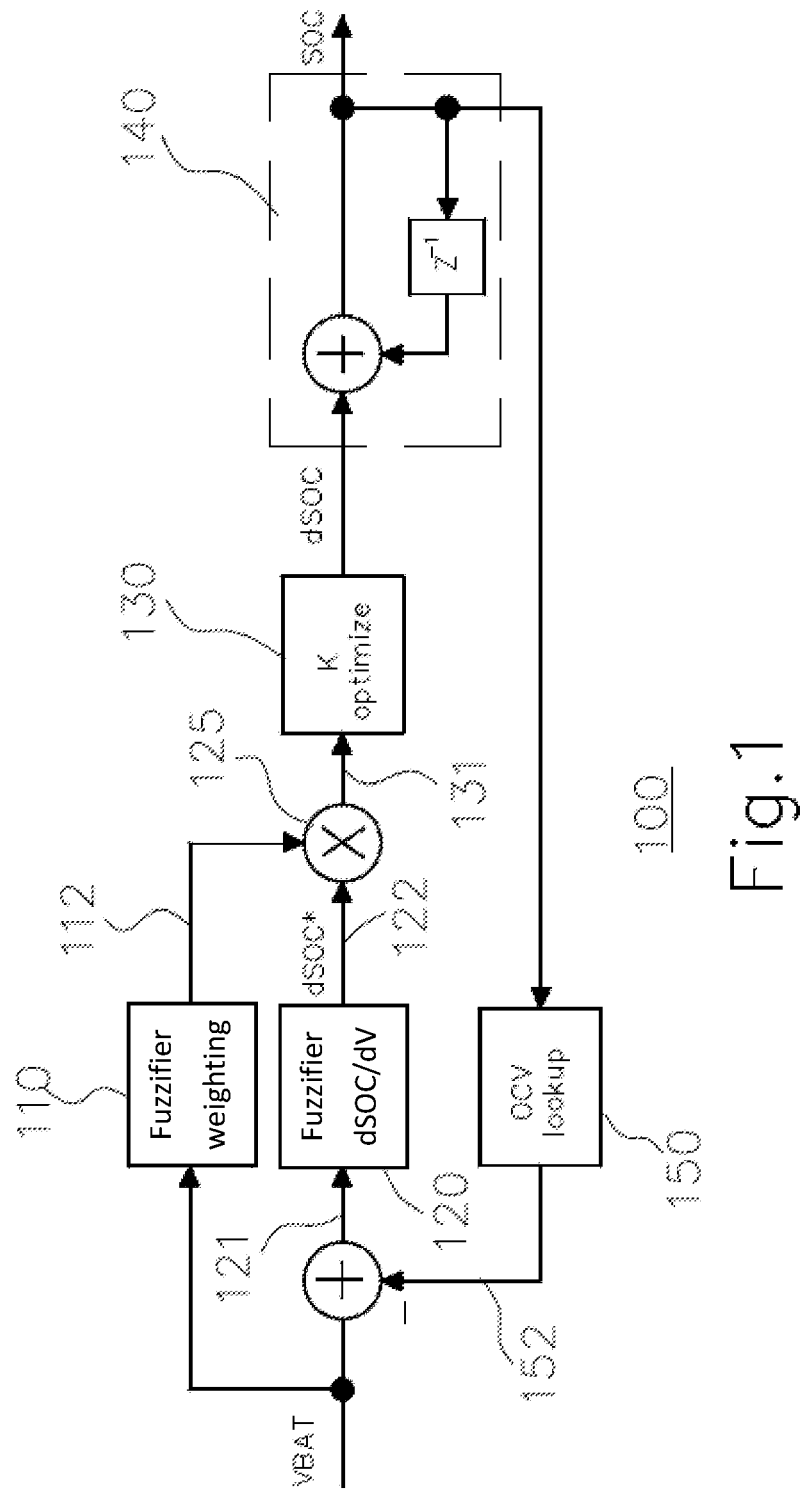
FIG. 1 is a block diagram of an exemplary block diagram of a method of estimating the state of charge of a battery in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The invention relates to a method for estimating the state of charge (SOC) of a battery when battery is in the at least states of: charging, discharging, and relaxing. The invention makes use of the battery voltage (VBAT) instead of the battery current. In order to build models in the method, we use standard charging and discharging processes to collect battery information. For example, we apply different charging and discharging currents to observe the SOC and the battery voltage (VBAT). Accordingly, based on the observation, we build a membership function (or relationship) between (1) the difference between the battery voltage (VBAT) and an open circuit voltage (OCV) of the battery; and (2) a SOC difference to be used to adjust the estimated SOC. Furthermore, based on the observation, we generate another membership function (or relationship) between a weighting (or gain) to be applied to the SOC difference and the battery voltage (VBAT). The two membership functions forms a general model, which can be optimized according to specific battery charging and discharging information. The specific battery data is usually the most frequent usage in user experiences. Additionally, we can find an optimized gain (K) by using minimized least square error method to further tune the SOC difference. The established models for example can be stored in a hardware memory or written into a software program.

In the embodiment, a method of estimating the state of charge (SOC) of a battery is proposed. The method includes: monitoring the battery voltage (VBAT); and estimating the SOC based on a first battery model, a second battery model, and the battery voltage. The first battery model includes a first predetermined relationship between the battery voltage and a first weight based on battery information collected by charging and discharging and relaxing the battery. The second battery model includes a second predetermined relationship between the difference between the battery voltage and an estimated open circuit voltage of the battery, and a SOC difference based on the battery information.

FIG. 1 is a block diagram of an exemplary block diagram of a method of estimating the state of charge of a battery in accordance with some embodiments. As shown in FIG. 1, a battery voltage estimation method 100 is provided. The method 100 includes a weighting fuzzifier 110, a dSOC/dV fuzzifier 120, a multiplier 125, an optimizer 130, an accumulator 140, and an open circuit voltage (OCV) lookup table 150. Each block in the diagram can be processed by hardware such as a circuit, or software such as a program executed by a microprocessor, or firmware.

The method 100 monitors a battery voltage (VBAT), e.g., by a voltage measurement or detector circuit. The weighting fuzzifier 110 estimates a first weight 112 based on the first battery model and the battery voltage VBAT. The dSOC/dV fuzzifier 120 estimates a SOC difference (dSOC*) 122 based on the second battery model and the difference 121 between the battery voltage VBAT and the estimated open circuit voltage 152 of the battery. The multiplier 125 generates a weighted SOC difference (dSOC) 131 based on the first weight 112 and the SOC difference (dSOC*) 122. In some embodiments, the optimizer 130 can apply additional gain (K value) to the weighted SOC difference (dSOC) 131 for optimization. Next, the accumulator 140 accumulates the weighted SOC difference (dSOC) 131 by using, for example, the inverse Z transformation to determine an estimated SOC. The estimated SOC is then fed back through the OCV lookup table 150 to generate the estimated open circuit voltage 152, and the process iterates. We will introduce the details of the method 100 in the following.

FIG. 2 is a measurement result for building the weighting fuzzifier and dSOC/dV fuzzifier in the method of estimating the state of charge of a battery in accordance with some embodiments. FIG. 2 includes two plots 210, 220 which are measured before the real-time estimation of the SOC in the method 100.

The plot 210 demonstrates the measurement result of the relationship between the battery voltage VBAT and the SOC with different charging conditions. The charging condition OCV refers to charging 2% battery capacity per hour; the charging condition 0.5 C means charging 50% battery capacity per hour; and the charging condition 0.25 C tells charging 25% battery capacity per hour. The plot 210 reveals that the greater the charging rate, the greater the battery voltage VBAT at the same SOC value.

The plot 220 demonstrates the measurement result of the relationship between the battery voltage VBAT and the SOC with different discharging conditions. The discharging condition OCV means discharging 2% battery capacity per hour. The discharging condition 0.5 C refers to discharging 50% battery capacity per hour. The discharging condition 0.25 C indicates discharging 25% battery capacity per hour. The discharging condition 0.15 C tells discharging 15% battery capacity per hour. The discharging condition 0.1 C refers to discharging 10% battery capacity per hour. The plot 220 reveals that the greater the discharging rate, the lower the battery voltage VBAT at the same SOC value. Next, we will move on to building the dSOC/dV fuzzifier 120 in FIG. 1.

Figure 3:
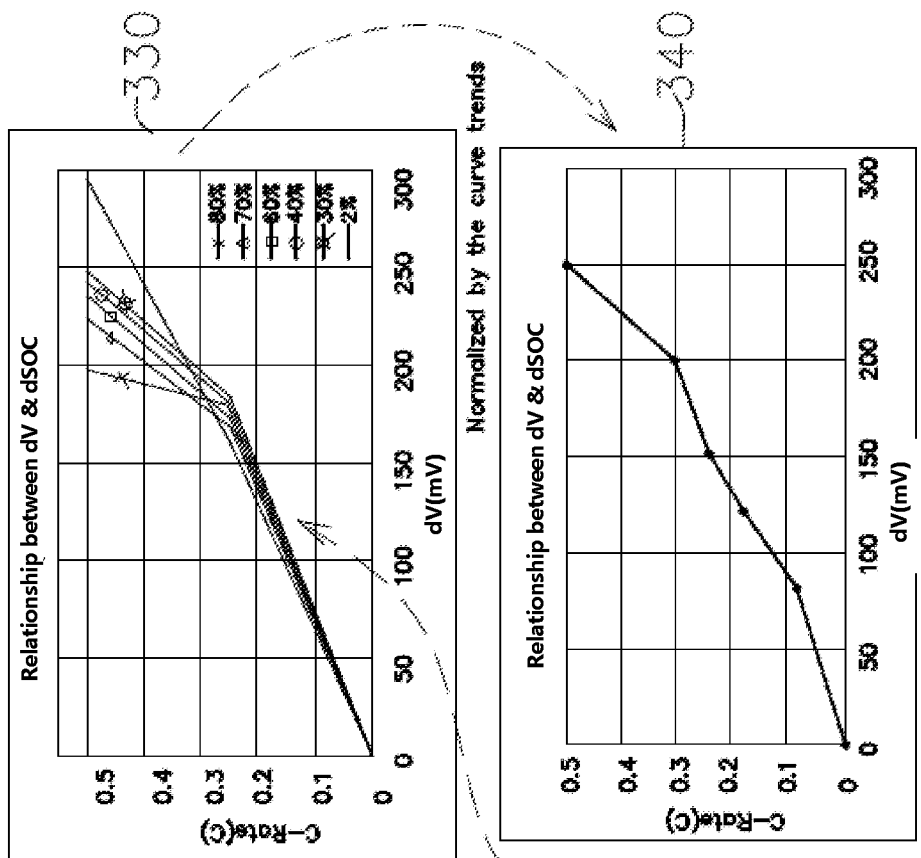
FIG. 3 shows one part of the model establishment for the dSOC/dV fuzzifier 120 in accordance with some embodiments.

FIG. 3 shows one part of the model establishment for the dSOC/dV fuzzifier 120 in accordance with some embodiments. FIG. 3 includes tables 310, 320 and plots 330, 340. The table 310 contains the information extracted from the plots 210 in FIG. 2. For example, with the same 80% SOC, the battery voltage is 4000 mV for charging 2% battery capacity per hour, and the battery voltage is 4179 mV for charging 25% battery capacity per hour. Moreover, with the same 60% SOC, the battery voltage is 3850 mV for charging 2% battery capacity per hour, and the battery voltage is 4023 mV for charging 25% battery capacity per hour.

The table 320 is produced based on the information in the table 310. For example, with the same 80% SOC, we take OCV (charging 2% battery capacity per hour) as a basis. The difference between the battery voltage for OCV and that for charging 25% battery capacity per hour is 179 mV calculated from 4179 mV-4000 mV. Meanwhile, with the same 60% SOC, the difference between the battery voltage for OCV and that for charging 25% battery capacity per hour is 173 mV calculated from 4023 mV-3850 mV. By iterating such calculating process, we can obtain the table 320. Furthermore, based on the table 320, we can find the relationship 330 between the voltage difference and the charging rate at different SOCs. By normalizing the relationship 330, a curve 340 is generated.

Figure 4:
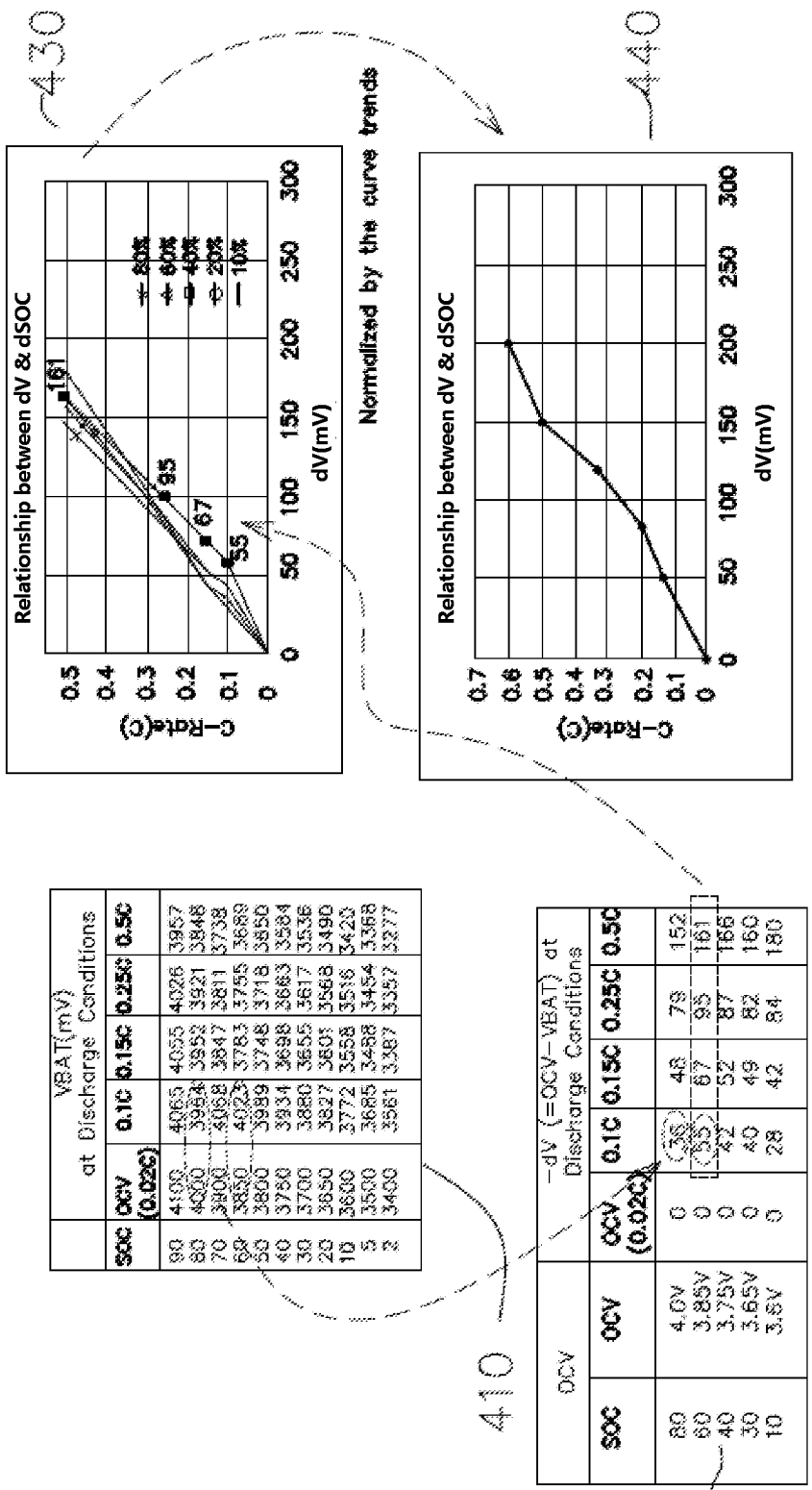
FIG. 4 shows another part of the model establishment for the dSOC/dV fuzzifier 120 in FIG. 1 in accordance with some embodiments.

FIG. 4 shows another part of the model establishment for the dSOC/dV fuzzifier 120 in FIG. 1 in accordance with some embodiments. FIG. 4 includes tables 410, 420 and plots 430, 440. The table 410 contains the information extracted from the plots 220 in FIG. 2. For example, with the same 80% SOC, the battery voltage is 4000 mV for discharging 2% battery capacity per hour, and the battery voltage is 3964 mV for discharging 10% battery capacity per hour. Moreover, with the same 60% SOC, the battery voltage is 3850 mV for discharging 2% battery capacity per hour, and the battery voltage is 3795 mV for discharging 10% battery capacity per hour.

The table 420 is produced based on the information in the table 410. For example, with the same 80% SOC, we take OCV (discharging 2% battery capacity per hour) as a basis. The difference between the battery voltage for OCV and that for discharging 10% battery capacity per hour is 36 mV calculated from 4000 mV-3964 mV. Meanwhile, with the same 60% SOC, the difference between the battery voltage for OCV and that for discharging 25% battery capacity per hour is 55 mV calculated from 3850 mV-3795 mV. By iterating such calculating process, we can obtain the table 420. Furthermore, based on the table 420, we can find the relationship 430 between the voltage difference and the discharging rate at different SOCs. By normalizing the relationship 430, a curve 440 is generated.

Figure 5:
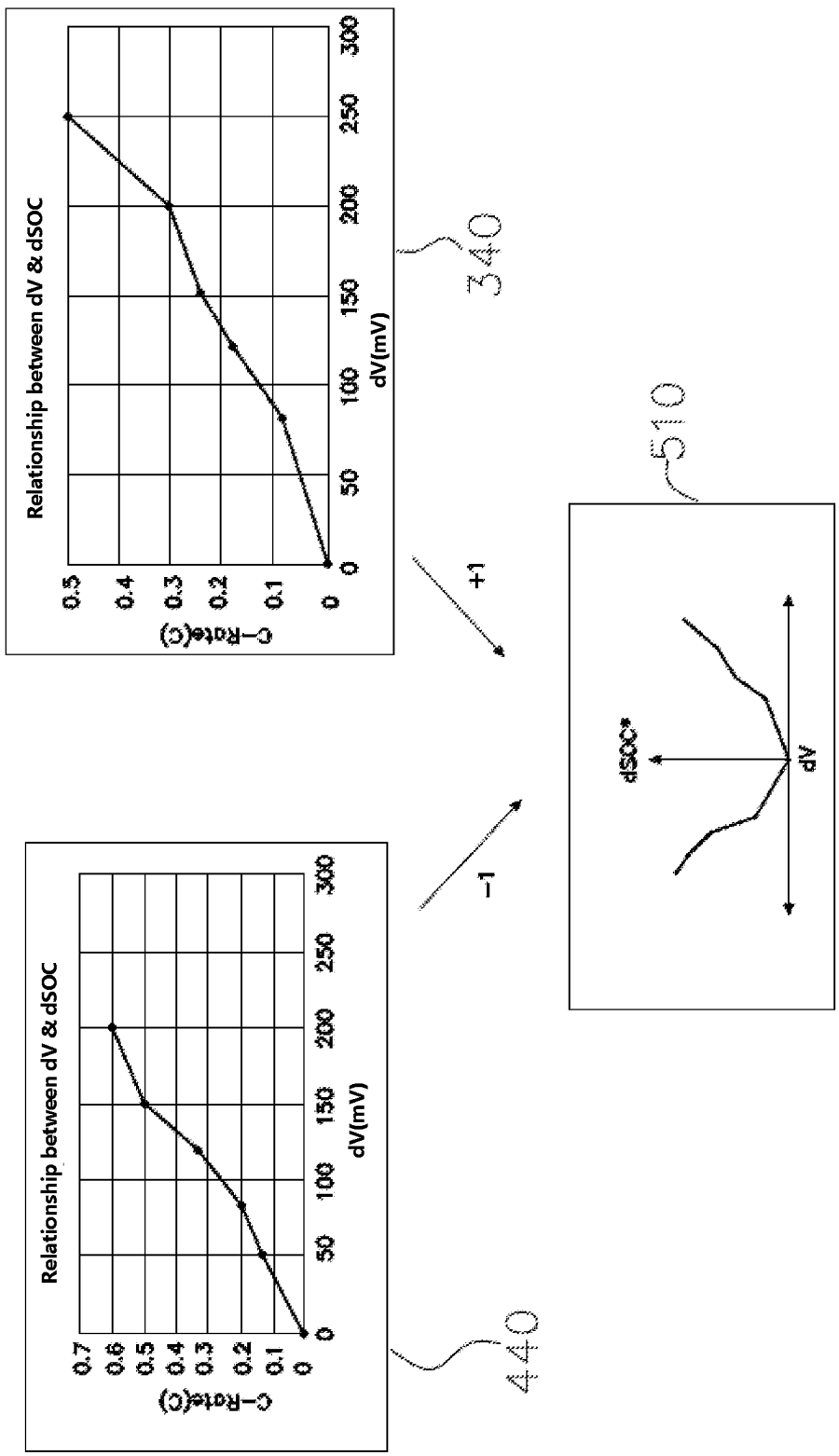
FIG. 5 shows an exemplary model of the dSOC/dV fuzzifier 120 in FIG. 1 in accordance with some embodiments.

FIG. 5 shows an exemplary model of the dSOC/dV fuzzifier 120 in FIG. 1 in accordance with some embodiments. By combining the curves 340, 440, we build up the second battery model 510 for the dSOC/dV fuzzifier 120 in FIG. 1. Such exemplary model 510 shows that the greater the absolute value of the difference (dV) between the battery voltage for OCV and that for charging/discharging condition, the greater the charging/discharging current (corresponding to the SOC difference (dSOC*) in FIG. 1), resulting in a V-shape relationship.

Figure 6:
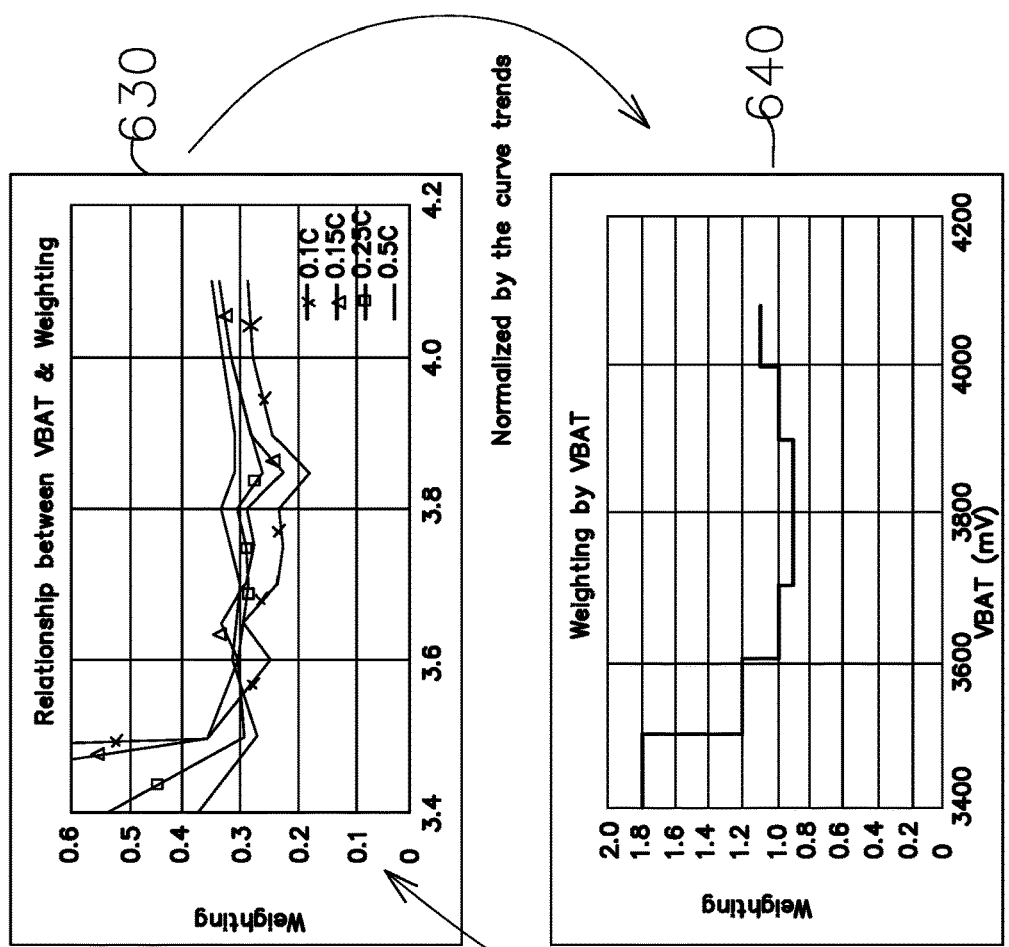
FIG. 6 shows the model establishment for the weighting fuzzifier 110 in FIG. 1 in accordance with some embodiments.

FIG. 6 shows the model establishment for the weighting fuzzifier 110 in FIG. 1 in accordance with some embodiments. FIG. 6 includes tables 610, 620 and plots 630, 640. The table 610 contains the information extracted from the plots 220 in FIG. 2. For example, with the same 90% SOC, the battery voltage is 4100 mV for discharging 2% battery capacity per hour, and the battery voltage is 4065 mV for discharging 10% battery capacity per hour. Moreover, with the same 80% SOC, the battery voltage is 4000 mV for discharging 2% battery capacity per hour, and the battery voltage is 3952 mV for discharging 15% battery capacity per hour. Additionally, with the same 70% SOC, the battery voltage is 3900 mV for discharging 2% battery capacity per hour, and the battery voltage is 3811 mV for discharging 25% battery capacity per hour.

The table 620 is produced based on the information in the table 610. For example, with the same 90% SOC, we take OCV (discharging 2% battery capacity per hour) as a basis. The weighting for VBAT 4.1V and discharging 10% battery capacity per hour is 0.29 calculated from 10/(4100-4065).

The weighting for VBAT 4.0V and discharging 15% battery capacity per hour is 0.31 calculated from 15/(4000−3952). The weighting for VBAT 3.9V and discharging 25% battery capacity per hour is 0.28 calculated from 25/(3900−3811). By iterating such calculating process, we can obtain the table 620. Furthermore, based on the table 620, we can find the relationship 630 between the battery voltage (VBAT) and the first weight 112 (in FIG. 1) at discharging current. By normalizing the relationship 630, the first model 640 for the weighting fuzzifier 110 in FIG. 1 is generated.

Figure 7:
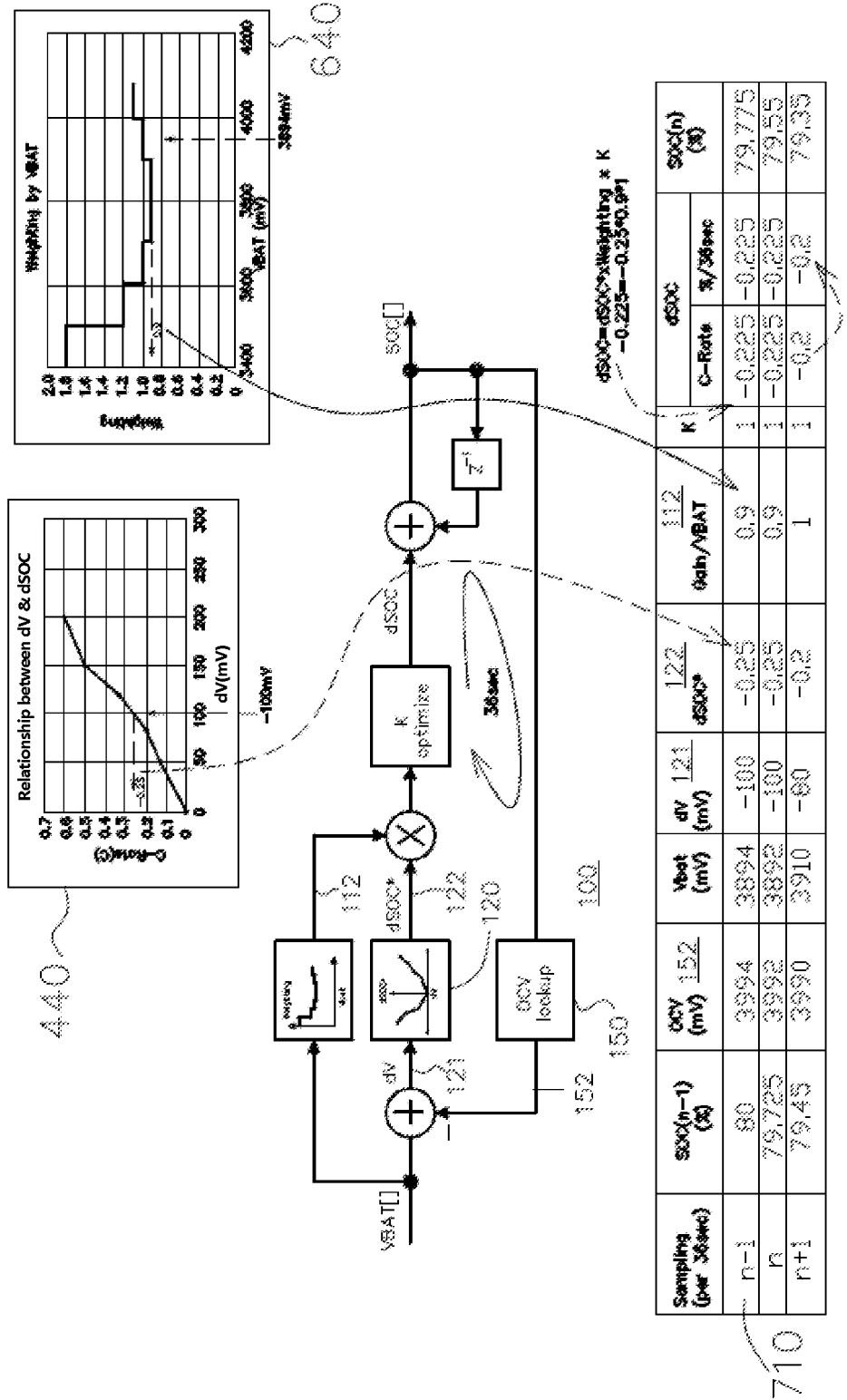
FIG. 7 shows a block diagram and an exemplary data table of an exemplary block diagram of a method of estimating the state of charge of a battery in accordance with some embodiments.

FIG. 7 shows a block diagram and an exemplary data table of an exemplary block diagram of a method of estimating the state of charge of a battery in accordance with some embodiments. As shown in FIG. 7, we recite the battery voltage estimation method 100 and incorporate the second battery model 510 in FIG. 5 and the first battery model 640 in FIG. 6 into the method 100. Due to the battery's experiencing a discharging condition, the plot 440, which is one part of the second battery model 510, is recited. Moreover, we provide an exemplary data table 710 for the nodes in the method 100.

In the first battery model 640, we can see that depending upon the VBAT, the first weighting 112 may be between 0.8 and 1.8. In this embodiment, at a VBAT of 3.894 Volts, the first weighting 112 that will be applied to the output of the Fuzzifier (dSOC/dV) block is 0.9.

The dSOC/dV fuzzifier 120 takes the difference (dV) 121 as its input. The battery voltage VBAT minus the estimated open circuit voltage 152 of the battery leaves the difference (dV) 121. The input to the OCV lookup table 150 is the SOC that is calculated by the method 100. As seen in this exemplary dSOC/dV fuzzifier 120, the greater the absolute value of dV 121 the greater the absolute value of the SOC difference (dSOC*) 122 output by the dSOC/dV fuzzifier 120. In the plot 440, it shows that at the difference (dV) 121 of −100 mV, for example, the SOC difference (dSOC*) 122 is −0.25.

As stated earlier the dSOC* calculated by the dSOC/dV fuzzifier 120 is weighted by the output of the weighting fuzzifier 110 and optimized in the optimizer 130. In some embodiments, the optimizer 130 weights and then, using least square optimization and the actual charge/discharge data of the battery, generates a K value that is used to calculate dSOC.

The method 100 then uses dSOC summed with the accumulator 140 (for example, the inverse Z transformation of SOC) to determine a new SOC value. The new SOC value is then fed back through the OCV lookup table 150 and the process iterates. An exemplary data table 710 shows the values in an exemplary battery showing 3 samples, one every 36 seconds. As can be seen from the above description of the method 100, it operates by determining the differential voltage and acting upon that using a plurality of fuzzy methods.

Figure 8:
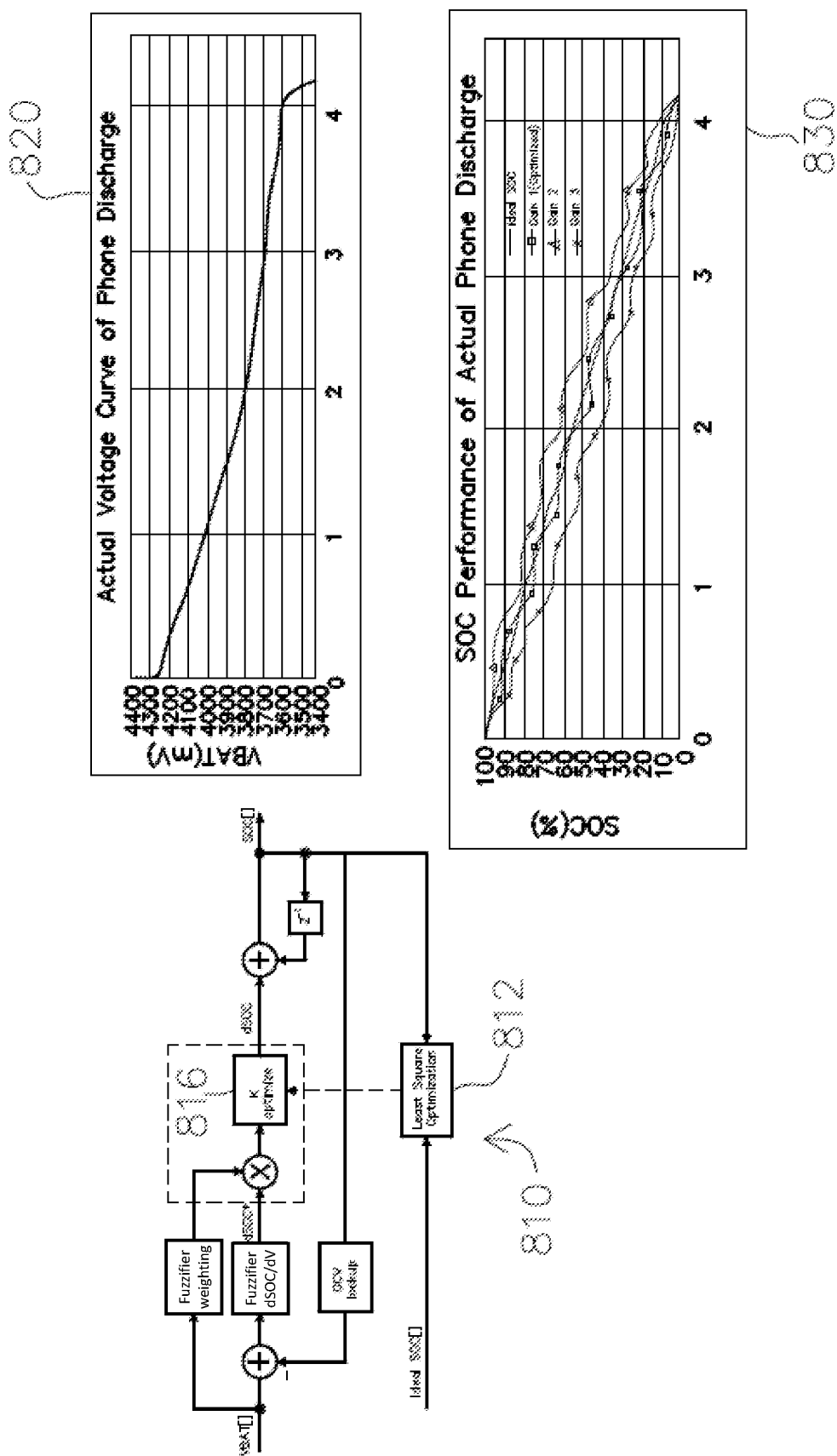
FIG. 8 shows experiment results by applying least square optimization to the method mentioned in the disclosure in accordance with some embodiments.

FIG. 8 shows experiment results applying least square optimization to the method mentioned in the disclosure in accordance with some embodiments. As shown in FIG. 8, a method 810 is similar to the method 100 in FIG. 1 but with additional least square optimization block 812. The corresponding battery voltage VBAT and SOC are respectively shown in plots 820, 830. The least square optimization block 812 receives the ideal SOC in the plot 830 measured by an external testing equipment and an estimated SOC in the plot 830 provided by the method 810. And the least square optimization block 812 gradually tunes an optimizer 816 accordingly. It is shown that based on the tuning conducted by the least square optimization block 812, different weights (or gains) #1-#3 are applied to the optimizer 816. It turns out that gain #1 has the better results among these three and is therefore selected as an optimized gain K.

Figure 9:
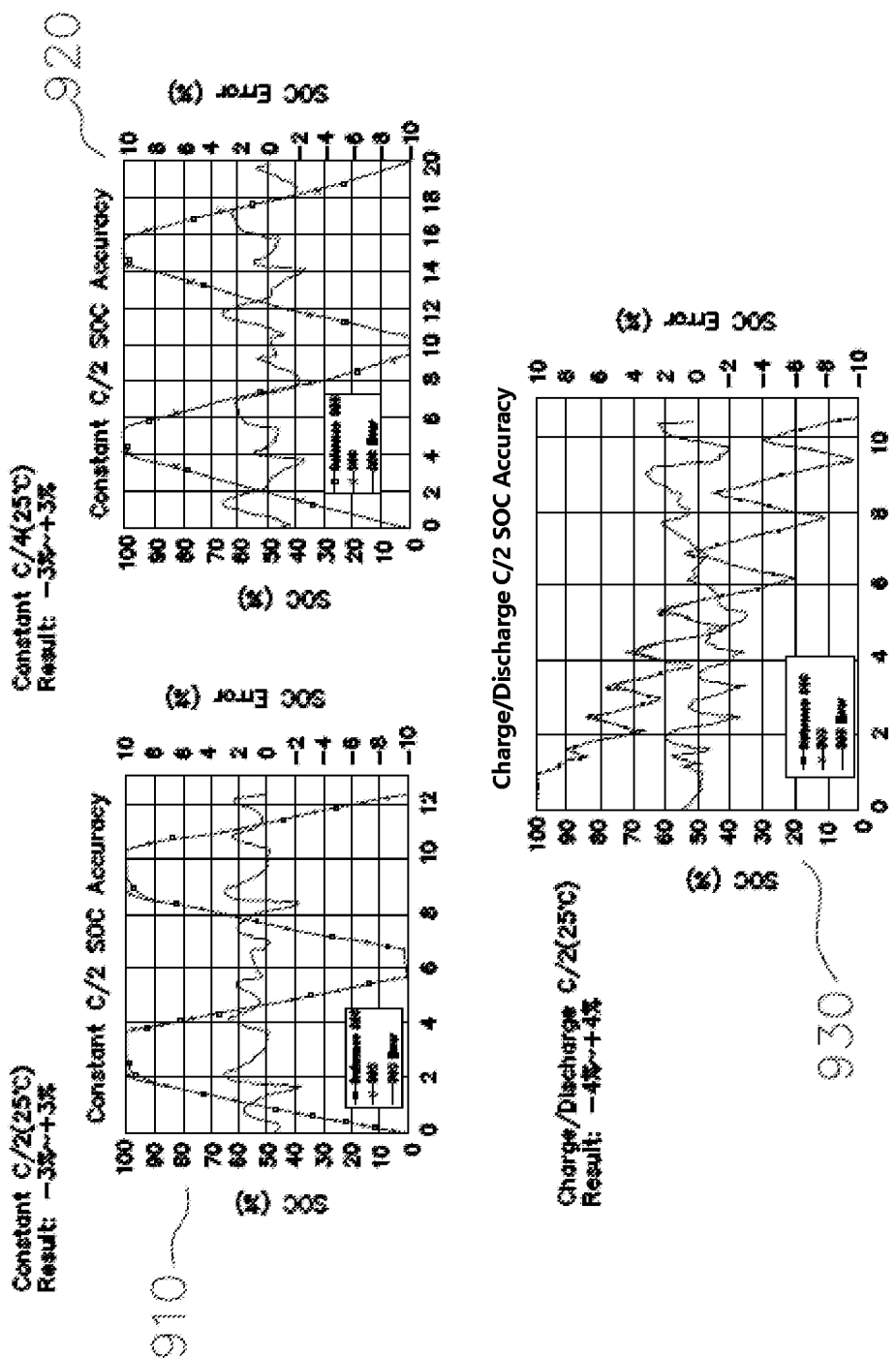
FIG. 9 shows experiment results by applying the method 100 of estimating the state of charge of a battery in FIG. 1 in accordance with some embodiments.

FIG. 9 shows experiment results by applying the method 100 of estimating the state of charge of a battery in FIG. 1 in accordance with some embodiments. FIG. 9 includes three plots 910-930 indicating estimated SOC errors at different charging/discharging condition. The plot 910 shows at 0.5 C standard charging/discharging rate, the estimated SOC errors is within about −3% to +3%. The plot 920 demonstrates at 0.25 C standard charging/discharging rate, the estimated SOC errors is also within about −3% to +3%. The plot 930 reveals at 0.5 C partial charging/discharging rate, the estimated SOC errors is also within about −4% to +4%. Thus, such plots 910-930 show the accuracy of the method 100.

Figure 10:
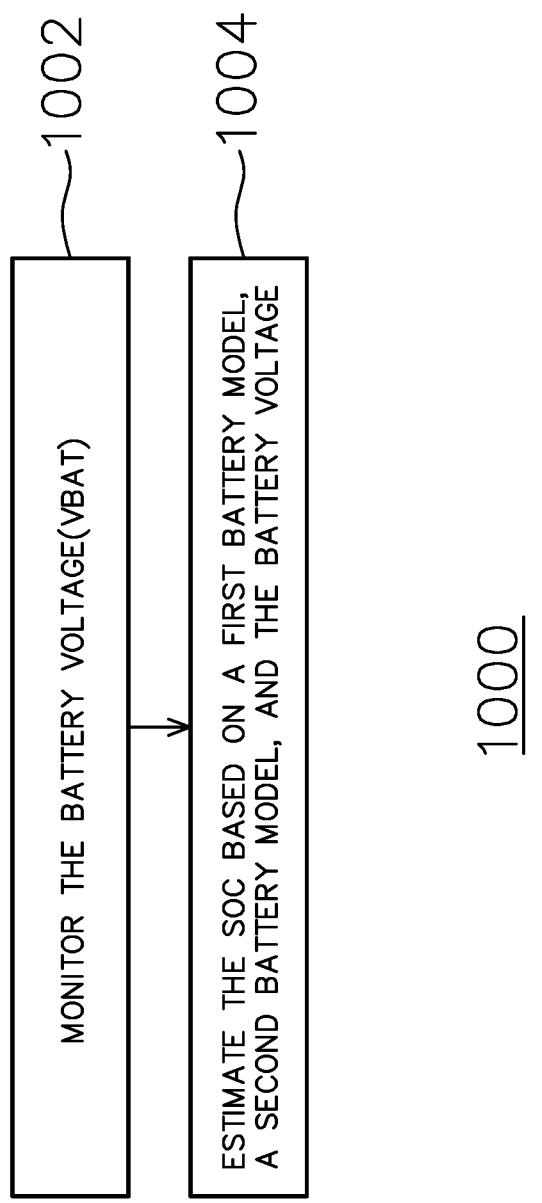
FIG. 10 is a flow chart of a method estimating the state of charge of a battery in accordance with some embodiments.

FIG. 10 is a flow chart of a method estimating the state of charge (SOC) of a battery in accordance with some embodiments. A method 1000 is provided and includes the following operations: monitoring the battery voltage (1002); and estimating the SOC based on a first battery model, a second battery model, and the battery voltage (1004), wherein the first battery model includes a first predetermined relationship between the battery voltage and a first weight based on battery information collected by charging and discharging and relaxing the battery, and wherein the second battery model includes a second predetermined relationship between the difference between the battery voltage and an estimated open circuit voltage of the battery, and a SOC difference based on the battery information.

In some embodiments, the operation of monitoring the battery voltage further comprises monitoring the battery voltage for a serial multiple battery cells when the battery in at least one of the states: charging, discharging, and relaxing. In some embodiments, the method 1000 further comprises collecting the battery information between the SOC and the battery voltage at different charging/discharging currents before the real-time estimation of the SOC. In some embodiments, the operation of estimating the SOC based on a first battery model, a second battery model, and the battery voltage further comprises estimating the SOC without monitoring battery current. However, in some other embodiments wherein the battery current information is readily available, the battery current information can be used to compensate or calibrate the estimation of the SOC, which will be described later.

In some embodiments, the method 1000 further comprises building the first battery model and the second battery model by measuring the SOC and the battery voltage at different charging/discharging currents. In some embodiments, the method 1000 further comprises building the first battery model by calculating the first weight using the difference between the battery voltage at different charging/discharging currents and the charging/discharging currents. In some embodiments, the method 1000 further comprises building the second battery model by calculating the SOC difference using the charging/discharging currents.

In some embodiments, the method 1000 further comprises: estimating the first weight based on the first battery model and the battery voltage; estimating the SOC difference based on the second battery model and the difference between the battery voltage and the estimated open circuit voltage of the battery; generating a weighted SOC difference based on the first weight and the SOC difference; accumulating the weighted SOC difference to provide an estimated SOC; and generating the estimated open circuit voltage of the battery based on the estimated SOC and a lookup table for the open circuit voltage.

Figure 11:
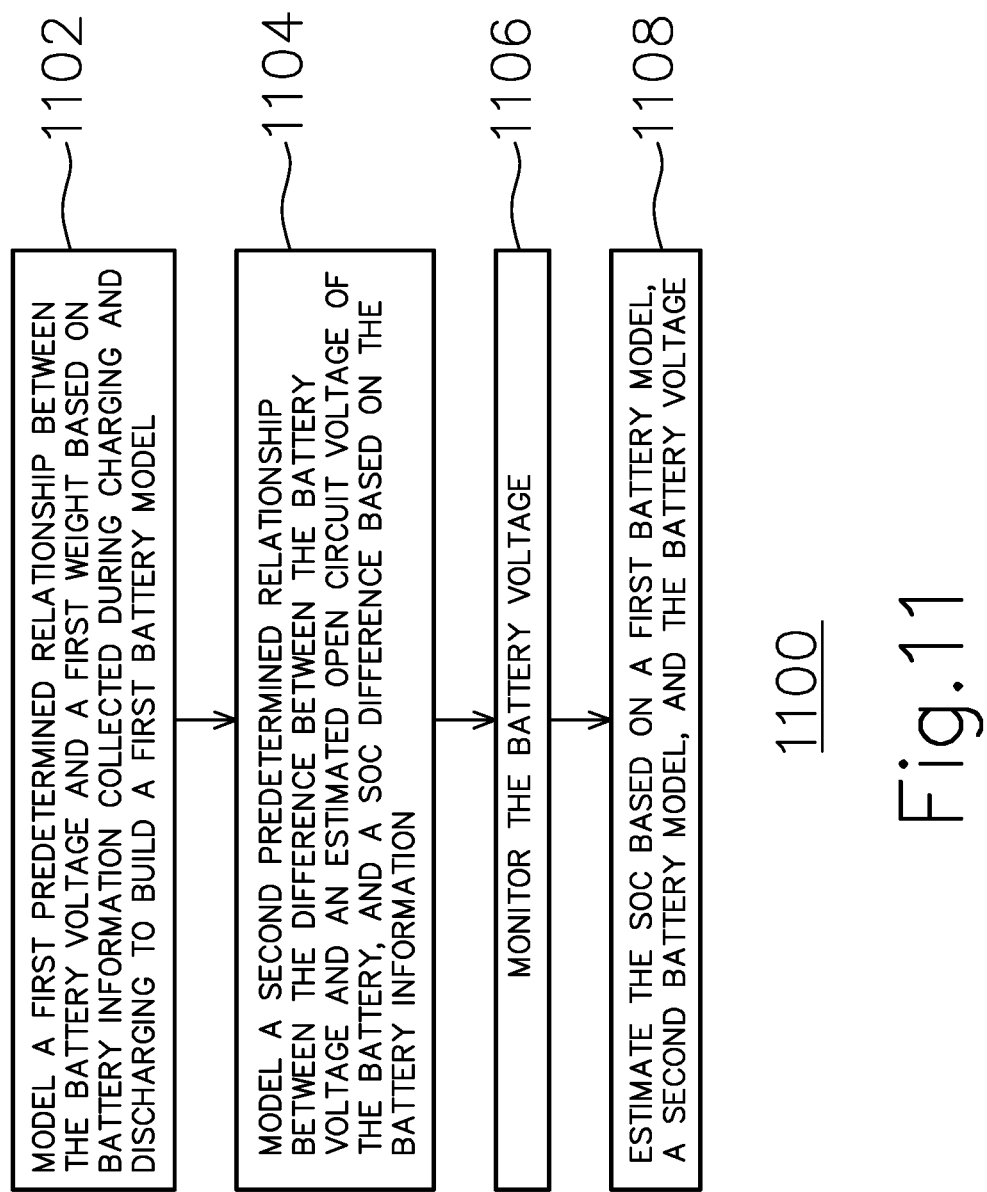
FIG. 11 is a flow chart of a method of estimating the state of charge of a battery based on the battery voltage in accordance with some embodiments.

FIG. 11 is a flow chart of a method of estimating the state of charge (SOC) of a battery based on the battery voltage in accordance with some embodiments. A method 1100 is provided and includes the following operations: modeling a first predetermined relationship between the battery voltage and a first weight based on battery information collected during charging and discharging to build a first battery model (1102); modeling a second predetermined relationship between the difference between the battery voltage and an estimated open circuit voltage of the battery, and a SOC difference based on the battery information (1104); monitoring the battery voltage (1106); and estimating the SOC based on a first battery model, a second battery model, and the battery voltage (1108).

In some embodiments, the operation of monitoring the battery voltage further comprises monitoring the battery voltage for multiple battery cells in series when the battery is in at least one of the states: charging, discharging, and relaxing. In some embodiments, the method 1100 further comprises collecting the battery information between the SOC and the battery voltage at different charging/discharging currents before the real-time estimation of the SOC. In some embodiments, the operation of estimating the SOC based on a first battery model, a second battery model, and the battery voltage further comprises estimating the SOC without monitoring battery current. However, in some other embodiments wherein the battery current information is readily available, the battery current information can be used to compensate or calibrate the estimation of the SOC, which will be described later. In some embodiments, the method 1100 further comprises building the first battery model and the second battery model by measuring the SOC and the battery voltage at different charging/discharging currents.

In some embodiments, the method 1100 further comprises building the first battery model by calculating the first weight using the difference between the battery voltage at different charging/discharging currents and the charging/discharging currents. In some embodiments, the method 1100 further comprises building the second battery model by calculating the SOC difference using the charging/discharging currents.

In some embodiments, the method 1100 further comprises estimating the first weight based on the first battery model and the battery voltage; estimating the SOC difference based on the second battery model and the difference between the battery voltage and the estimated open circuit voltage of the battery; generating a weighted SOC difference based on the first weight and the SOC difference; accumulating the weighted SOC difference to provide an estimated SOC; and generating the estimated open circuit voltage of the battery based on the estimated SOC and a lookup table for the open circuit voltage.

Figure 12:
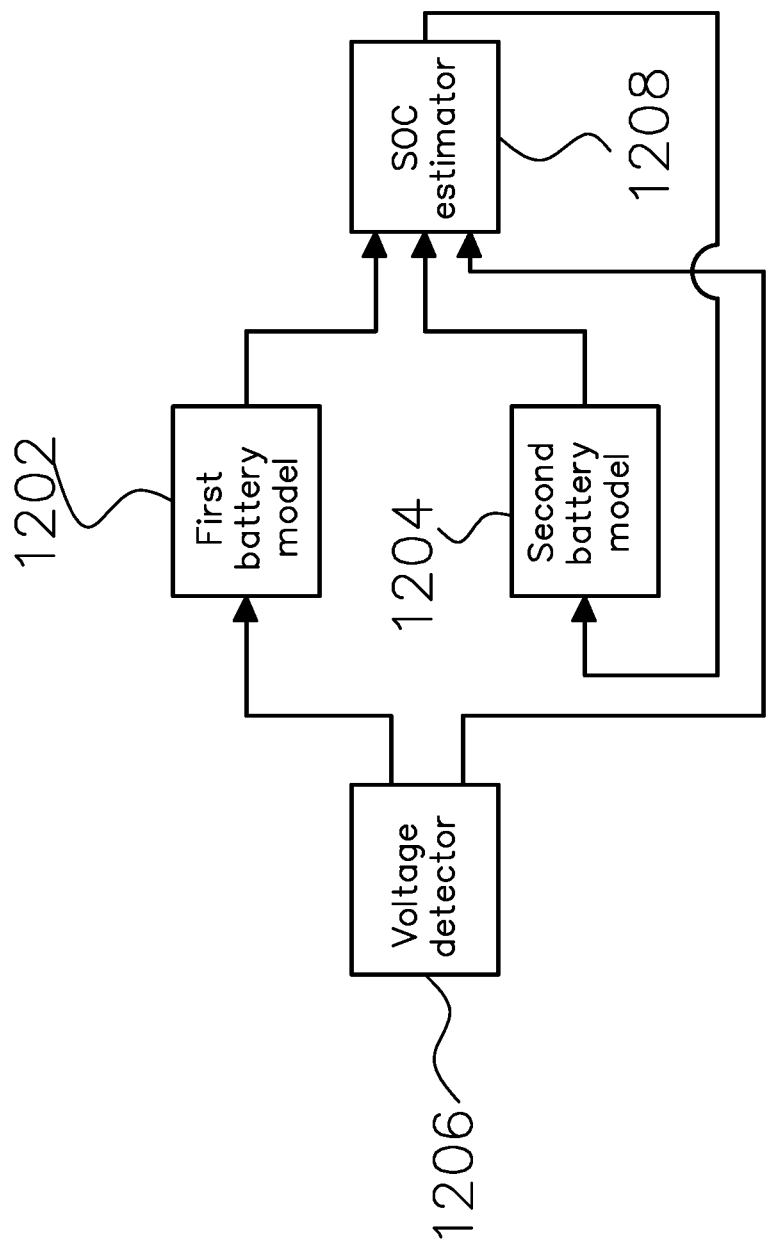
FIG. 12 is a block diagram of a system of estimating the state of charge of a battery based on the battery voltage in accordance with some embodiments.

FIG. 12 is a block diagram of a system of estimating the state of charge (SOC) of a battery based on the battery voltage in accordance with some embodiments. A system 1200 is provided and includes: a first battery model 1202 including a first predetermined relationship between the battery voltage and a first weight based on battery information collected by charging and discharging and relaxing the battery; a second battery model 1204 including a second predetermined relationship between the difference between the battery voltage and an estimated open circuit voltage of the battery, and a SOC difference based on the battery information; a voltage detector 1206 monitoring the battery voltage (VBAT); and a SOC estimator 1208 connected to the voltage detector and estimating the SOC based on the first battery model, the second battery model, and the battery voltage.

In some embodiments, the voltage detector further monitors the battery voltage for a serial multiple battery cells when the battery in at least one of the states: charging, discharging, and relaxing. In some embodiments, the first battery model and the second battery model collects the battery information between the SOC and the battery voltage at different charging/discharging currents before the SOC estimator starts real-time estimation of the SOC. In some embodiments, the SOC estimator estimates the SOC without monitoring battery current. However, in some other embodiments wherein the battery current information is readily available, the battery current information can be used to compensate or calibrate the estimation of the SOC.

Figure 13:
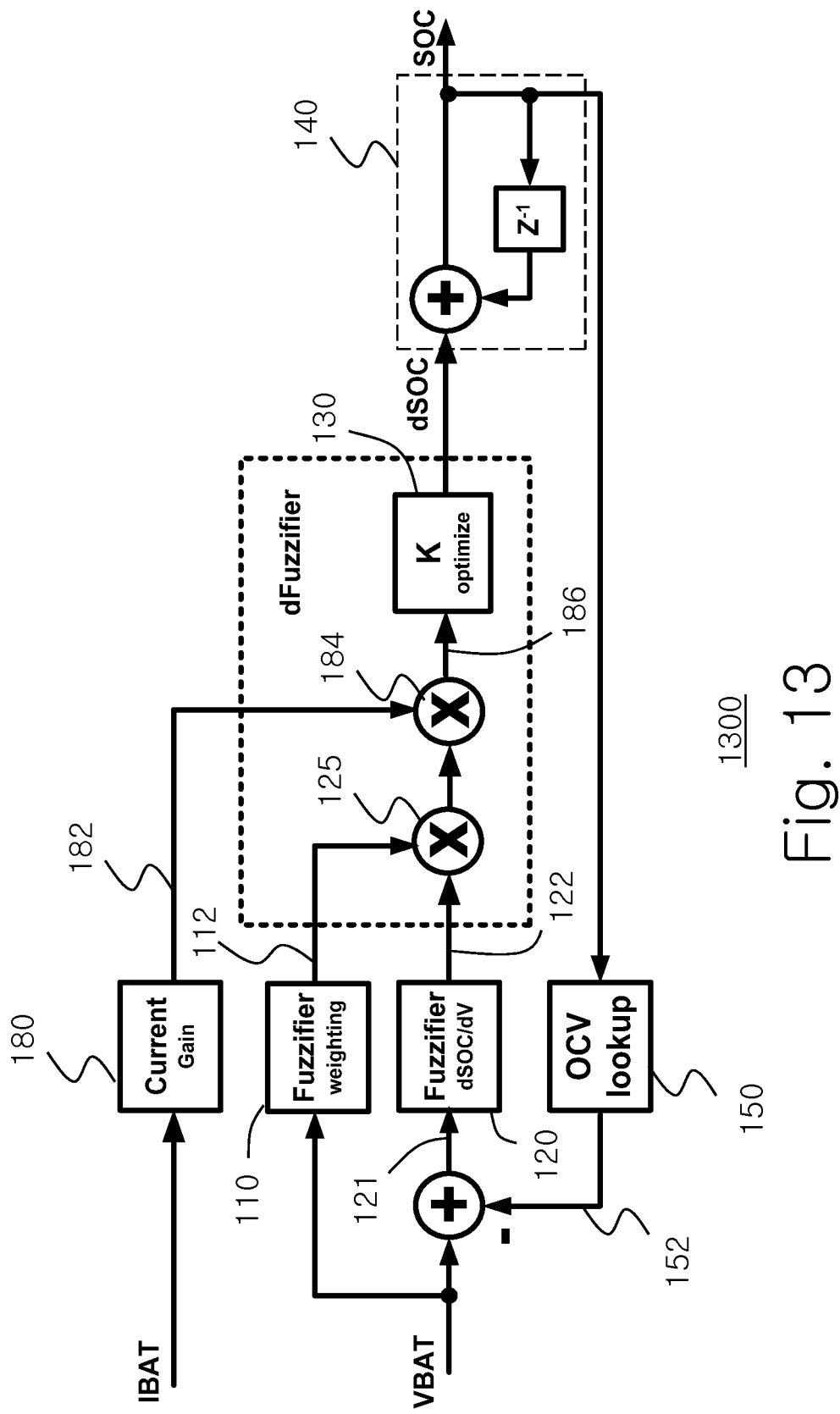
FIG. 13 is a block diagram of an exemplary block diagram of a method of estimating the state of charge of a battery in accordance with some embodiments.

Please refer to FIG. 13, which is a block diagram of an exemplary block diagram of a method of estimating the SOC of a battery in accordance with some embodiments. Each block in the diagram cam be processed by hardware such as a circuit, or software such as a program executed by a microprocessor, or firmware. In the embodiments shown in FIG. 13, the battery current information is readily available. As shown in FIG. 13, a battery voltage estimation method 1300 is provided. The method 1300 is similar to the method 100, but the method 1300 also obtains information related to battery current (IBAT). Preferably but not necessary, the battery current (IBAT) is multiplied by a current gain 180. The battery current information 182, which in this embodiment is the battery current (IBAT) multiplied by a current gain 180, is sent to a compensator 184. The compensator 184 compensates or calibrates the output of the multiplier 125 to obtain a compensated weighted SOC difference 186. In one embodiment, the compensator 184 is embodied as a multiplier. In other embodiments, the compensator 184 can be embodied as an adder, or a more complicated calculation unit performing a calculation to compensate or calibrate the output of the multiplier 125 according to the battery current information. In one embodiment, preferably but not necessarily, the compensated weighted SOC difference 186 is optimized by the optimizer 130. Thus, in the embodiments shown in FIG. 13, the estimation of the SOC can be adjusted according to the battery current information. Note that the method 1300 is applicable to the methods 1000 and 1100.

Figure 14:
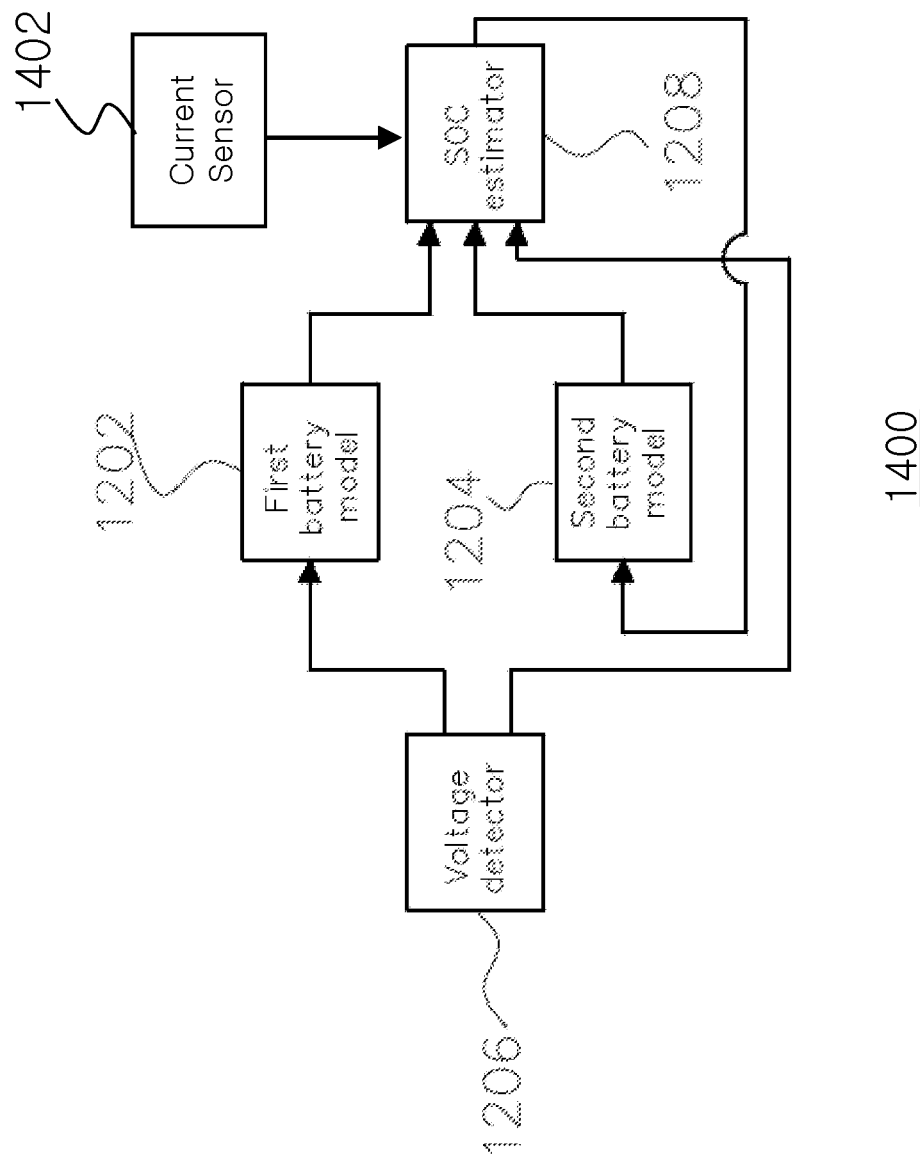
FIG. 14 is a block diagram of a system of estimating the state of charge (SOC) of a battery based on the battery voltage in accordance with some embodiments.

Please refer to FIG. 14, which is a block diagram of a system of estimating the state of charge (SOC) of a battery based on the battery voltage in accordance with some embodiments. The system 1400 is similar to the system 1200, except that the SOC estimator 1208 further receives current information, which for example comes from a current sensor 1402. The SOC estimator 1208 is connected to the voltage detector 1206 and the current sensor 1402, and the SOC estimator 1208 estimates the SOC based on the first battery model, the second battery model, and the battery voltage, and compensates the estimation of the SOC according to the battery current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of estimating the state of charge (SOC) of a battery, comprising: monitoring the battery voltage (VBAT); applying a first weighting to the battery voltage by a first fuzzifier, to obtain a first weight, wherein the first weighting is obtained by measuring the SOC and the battery voltage at different charging/discharging currents and calculated by using differences between the battery voltage at different charging/discharging currents and the charging/discharging currents; obtaining a SOC difference between a present SOC and a previously obtained SOC, and dividing the dSOC by a voltage difference between the present battery voltage and an open circuit voltage of the battery by a second fuzzifier, to obtain a derived SOC difference (dSOC/dV); generating a weighted SOC difference according to the first weight and the derived SOC difference, by a multiplier; and accumulating the weighted SOC difference to obtain an estimated SOC, by an accumulator.

2. The method of claim 1, further comprising:
optimizing the weighted SOC difference by a gain, by an optimizer.

3. The method of claim 1, further comprising:
estimating the open circuit voltage of the battery according to the estimated SOC and a reference table.

4. The method of claim 1, further comprising:
applying a second weighting to a current of the battery by a gain fuzzifier, to obtain a second weight; and
compensating the derived SOC difference by the second weight, by a compensator.

5. The method of claim 1, wherein monitoring the battery voltage further comprises monitoring the battery voltage for multiple battery cells in series when the battery is in at least one of the states: charging, discharging, and relaxing.

6. The method of claim 1, further comprising collecting the battery information between the SOC and the battery voltage at different charging/discharging currents before real-time estimation of the SOC.

7. A system of estimating the state of charge (SOC) of a battery based on a battery voltage, comprising:
a memory or a software program storing a first battery model including a first predetermined relationship between the battery voltage and a first weight based on battery information collected by charging and discharging and relaxing the battery, and a second battery model including a second predetermined relationship between the difference between the battery voltage and an estimated open circuit voltage of the battery, and a SOC difference based on the battery information;
a voltage detector monitoring the battery voltage (VBAT);
a current sensor providing information of a current of the battery; and
a SOC estimator connected to the voltage detector and the current sensor, the SOC estimator estimating the SOC based on the first battery model, the second battery model, and the battery voltage to obtain an estimation of the SOC, and compensating the estimation of the SOC according to the information of the current of the battery,
wherein the first and second battery models are built by measuring the SOC and the battery voltage at different charging/discharging currents and the first weight is calculated using differences between the battery voltage at different charging/discharging currents and the charging/discharging currents.

8. The system of claim 7, wherein the voltage detector further monitors the battery voltage for a serial multiple battery cells when the battery in at least one of the states: charging, discharging, and relaxing.

9. The system of claim 8, wherein the first battery model and the second battery model collects the battery information between the SOC and the battery voltage at different charging/discharging currents before the SOC estimator starts real-time estimation of the SOC.

10. The system of claim 7, wherein the second battery model is built by calculating the SOC difference using the charging/discharging currents.

* * * * *